(12) United States Patent
Alves et al.

(10) Patent No.: US 7,840,860 B2
(45) Date of Patent: *Nov. 23, 2010

(54) DOUBLE DRAM BIT STEERING FOR MULTIPLE ERROR CORRECTIONS

(75) Inventors: Luiz Carlos Alves, Hopewell Junction, NY (US); Mark Andrew Brittain, Pflugerville, TX (US); Timothy Jay Dell, Colchester, VT (US); Sanjeev Ghai, Round Rock, TX (US); Warren Edward Maule, Cedar Park, TX (US); Scott Barnett Swaney, Catskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/188,033

(22) Filed: Aug. 7, 2008

(65) Prior Publication Data

US 2008/0294950 A1 Nov. 27, 2008

Related U.S. Application Data

(63) Continuation of application No. 11/054,417, filed on Feb. 9, 2005, now Pat. No. 7,523,364.

(51) Int. Cl.
*G11C 29/00* (2006.01)

(52) U.S. Cl. .......................... 714/710; 714/6; 714/718; 714/758; 714/763; 714/799; 365/200; 365/201

(58) Field of Classification Search .................. 714/6, 714/710, 758, 25, 763, 766, 768; 365/200, 365/201

See application file for complete search history.

(56) References Cited

U.S. PATENT DOCUMENTS

| | | | | |
|---|---|---|---|---|
| 5,267,242 A * | 11/1993 | Lavallee et al. | ............... | 714/7 |
| 5,923,682 A * | 7/1999 | Seyyedy | ................... | 714/773 |
| 5,974,564 A * | 10/1999 | Jeddeloh | ..................... | 714/8 |
| 6,119,049 A * | 9/2000 | Peddle | ...................... | 700/121 |
| 6,418,068 B1 * | 7/2002 | Raynham | ................... | 365/200 |
| 6,473,449 B1 * | 10/2002 | Cafarella et al. | ............ | 375/141 |
| 6,658,076 B1 * | 12/2003 | Hayata | ....................... | 375/377 |
| 6,725,414 B2 * | 4/2004 | Seyyedy | ..................... | 714/773 |
| 6,754,117 B2 | 6/2004 | Jeddeloh | | |
| 6,892,159 B2 * | 5/2005 | Weiss et al. | ................. | 702/130 |
| 7,137,020 B2 * | 11/2006 | Gilstrap et al. | ............. | 713/324 |

* cited by examiner

*Primary Examiner*—Esaw T Abraham
(74) *Attorney, Agent, or Firm*—Dillon & Yudell LLP

(57) ABSTRACT

A method and system is presented for correcting a data error in a primary Dynamic Random Access Memory (DRAM) in a Dual In-line Memory Module (DIMM). Each DRAM has a left half (for storing bits 0:3) and a right half (for storing bits 4:7). A determination is made as to whether the data error was in the left or right half of the primary DRAM. The half of the primary DRAM in which the error occurred is removed from service. All subsequent reads and writes for data originally stored in the primary DRAM's defective half are made to a half of a spare DRAM in the DIMM, while the DRAM's non-defective half continues to be used for subsequently storing data.

19 Claims, 9 Drawing Sheets

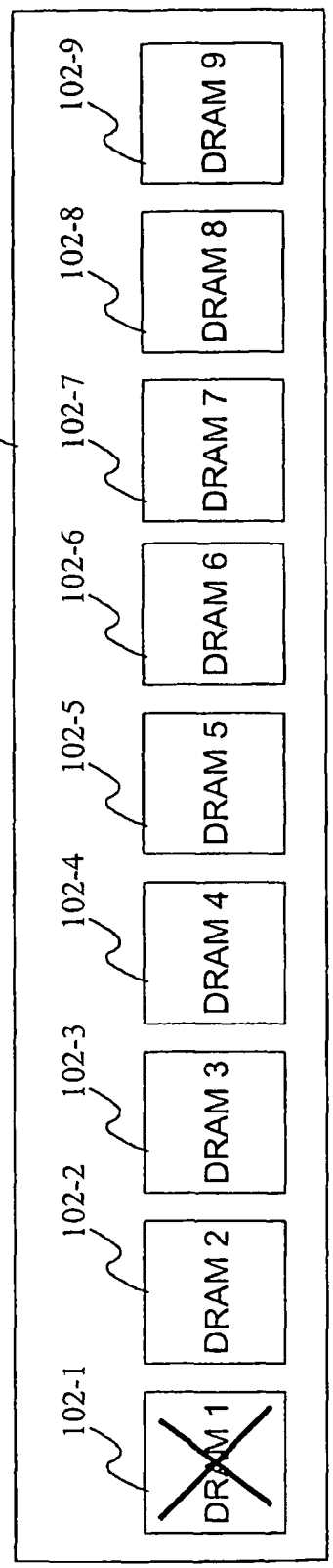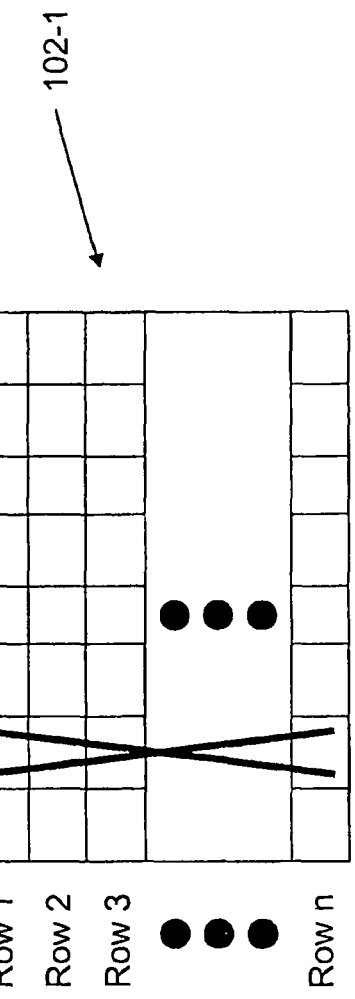
Figure 1a
(Prior art)
Figure 1b
(Prior art)

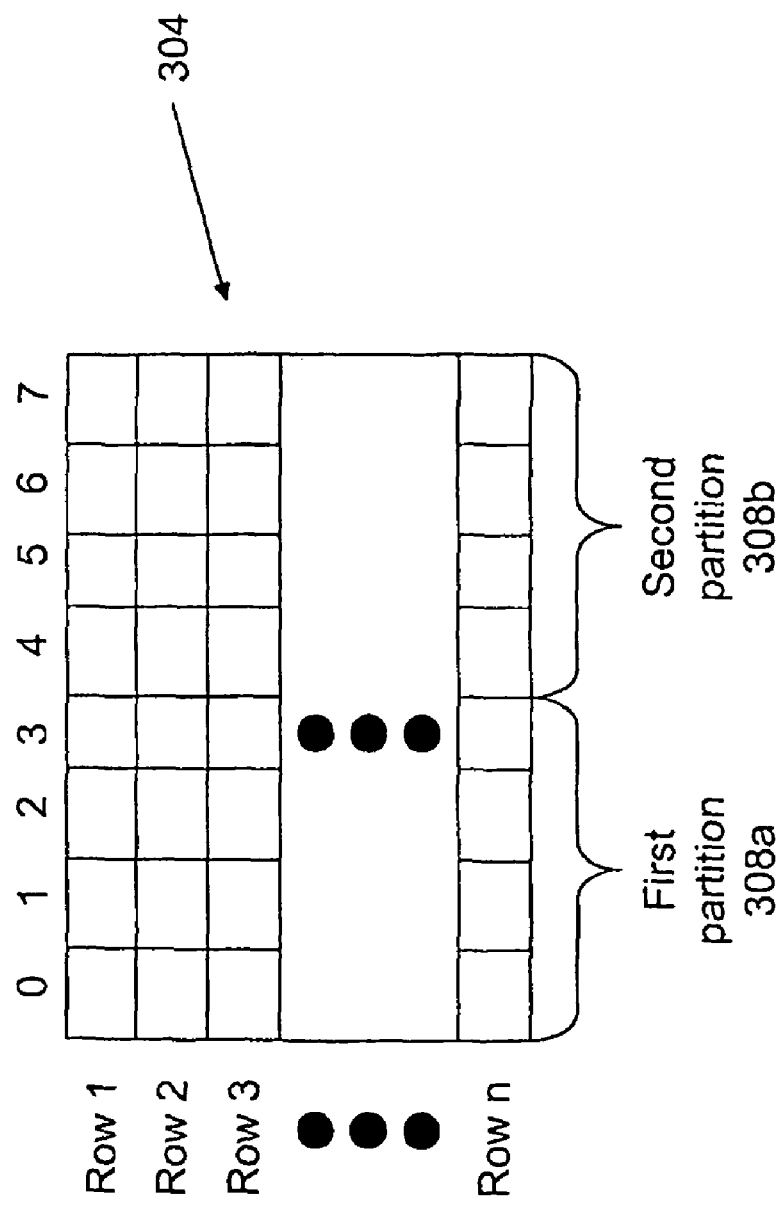

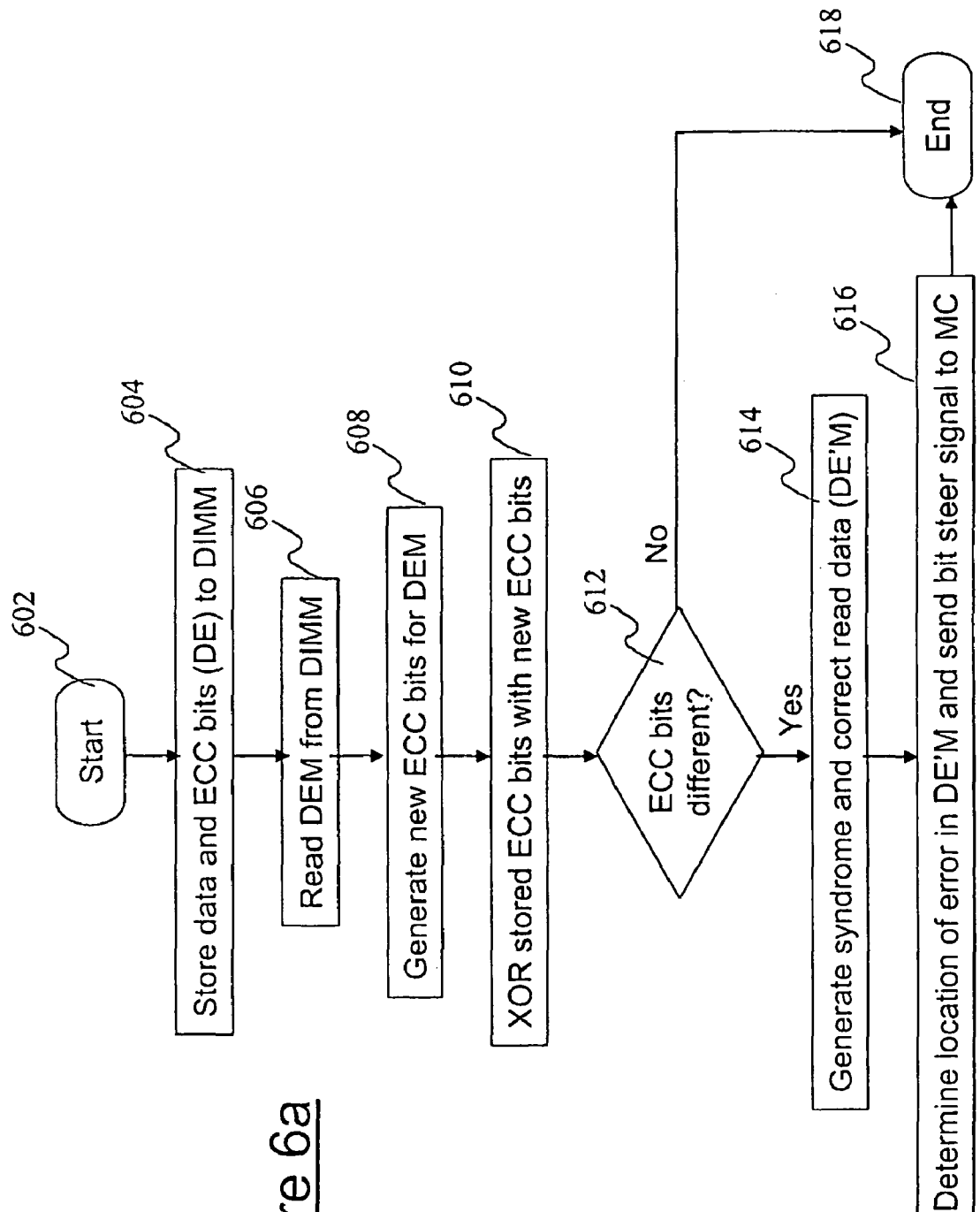

DOUBLE DRAM BIT STEERING FOR MULTIPLE ERROR CORRECTIONS

PRIORITY CLAIM

The present application is a continuation of U.S. patent application Ser. No. 11/054,417, titled "Double DRAM Bit Steering for Multiple Error Corrections," filed on Feb. 9, 2005, now U.S. Pat. No. 7,523,364, issued on Apr. 21, 2009, the contents of which is incorporated herein by reference in its entirety

BACKGROUND OF THE INVENTION

1. Technical Field

The present invention relates in general to the field of computers, and in particular to memory devices. Still more particularly, the present invention relates to a method and system for self-healing a memory module, which has multiple memory sub-modules, by removing a portion of one of the multiple memory sub-modules from service.

2. Description of the Related Art

A key feature of modern computers is modularity. That is, with few or no tools, a computer owner can replace different components inside the computer's enclosure. By simply snapping in new components into existing sockets and/or cables, a non-expert user can install and/or replace his computer's hard drive, a wireless modem, and even a main processor. One of the most common components to be replaced, usually due to failure, is the computer's system memory.

Early computers primarily used Static Random Access Memory (SRAM) for system memory. While SRAMs are still in common use, particularly where memory speed is essential, they have some drawbacks. For example, SRAM draws a significant amount of power when in stand-by mode, and thus is not very useful in a battery powered device such as a laptop computer or a Personal Digital Assistant (PDA). Similarly, SRAMs are physically large, thus making them difficult to use in small computing devices such as PDAs, as well as in any other computer system, including servers, in which space is limited. Finally, SRAMs are relatively expensive, especially in comparison to Dynamic Random Access Memory (DRAM).

DRAMs use a network of storage cells that are each made up of a transistor that is under the logical control of a capacitor. Since capacitors tend to lose their charge quickly, DRAMs must refresh the storage cells (replenish the charge to the capacitors) every few milliseconds. Nonetheless, DRAMs draw less operational current than SRAMs.

As noted above, in modern computers, system memory is packaged to be easily installed and/or replaced. A common type of easily installed system memory comes as a package known as a Single In-line Memory Module (SIMM). Within the SIMM are multiple memory sub-modules of Dynamic Random Access Memory (DRAM) memory. Each memory sub-module is typically referred to simply as a DRAM.

Another popular type of replaceable system memory is a Dual In-line Memory Module (DIMM). A DIMM is similar to a SIMM except that a DIMM has DRAMs on two sides of an interior of the DIMM, rather than on just one side (as is found in the SIMM). By having memory on both sides of its interior, the DIMM obviously can hold more DRAMs and thus more memory is available to the computer.

A significant problem with DRAMs is that they are somewhat prone to failure. For example, consider a DIMM 100 shown in FIG. 1a. DIMM 100 contains n-number of DRAMS 102. If one or more of the DRAMS 102 fails, then the entire DIMM 100 can be snapped out and replaced. Alternatively, if only one of the DRAMs 102 (e.g., DRAM 102-1) should fail, then the failed DRAM (102-1) can be taken out of service, and DIMM 100 is able to continue to function at a reduced level. While taking only the failed DRAM 102-1 out of service rather than the entire DIMM 100 is a savings improvement, removing the entire DRAM 102-1 from service is still wasteful, particularly if only a portion of the DRAM 102-1 is actually defective. For example, assume that, as shown in FIG. 1b, only one of the columns of storage cells (column 1) is defective. By taking DRAM 102-1 out of service, then the rest of the columns that are still good (columns 0 and 2-7) are now wasted.

What is needed, therefore, is a method and system for reclaiming a use of a second portion of a memory sub-module (such as a DRAM in a DIMM) when a first portion of the DRAM fails. Preferably, such a method and system will be automatic to allow the DIMM to be self-healing.

SUMMARY OF THE INVENTION

The present invention is thus directed to a method and system for correcting a data error in a primary Dynamic Random Access Memory (DRAM) in a Dual In-line Memory Module (DIMM). Each DRAM has a left half (for storing bits 0:3) and a right half (for storing bits 4:7). A determination is made as to whether the data error was in the left or right half of the primary DRAM. The half of the primary DRAM in which the error occurred is removed from service. All subsequent reads and writes for data originally stored in the primary DRAM's defective half are made to a half of a spare DRAM in the DIMM, while the DRAM's non-defective half continues to be used for subsequently storing data.

The above, as well as additional purposes, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

FIGS. 1a-b illustrate a prior art Dual In-line Memory Module (DIMM) having a defective Dynamic Random Access Memory (DRAM) sub-module;

FIG. 3b depicts a first partition and a second partition in a DRAM;

FIG. 6a is a flow-chart of steps taken to store corrected data in the primary and spare DRAMs.

DETAILED DESCRIPTION OF THE PREFERRED EMBODIMENT

Figure 2:
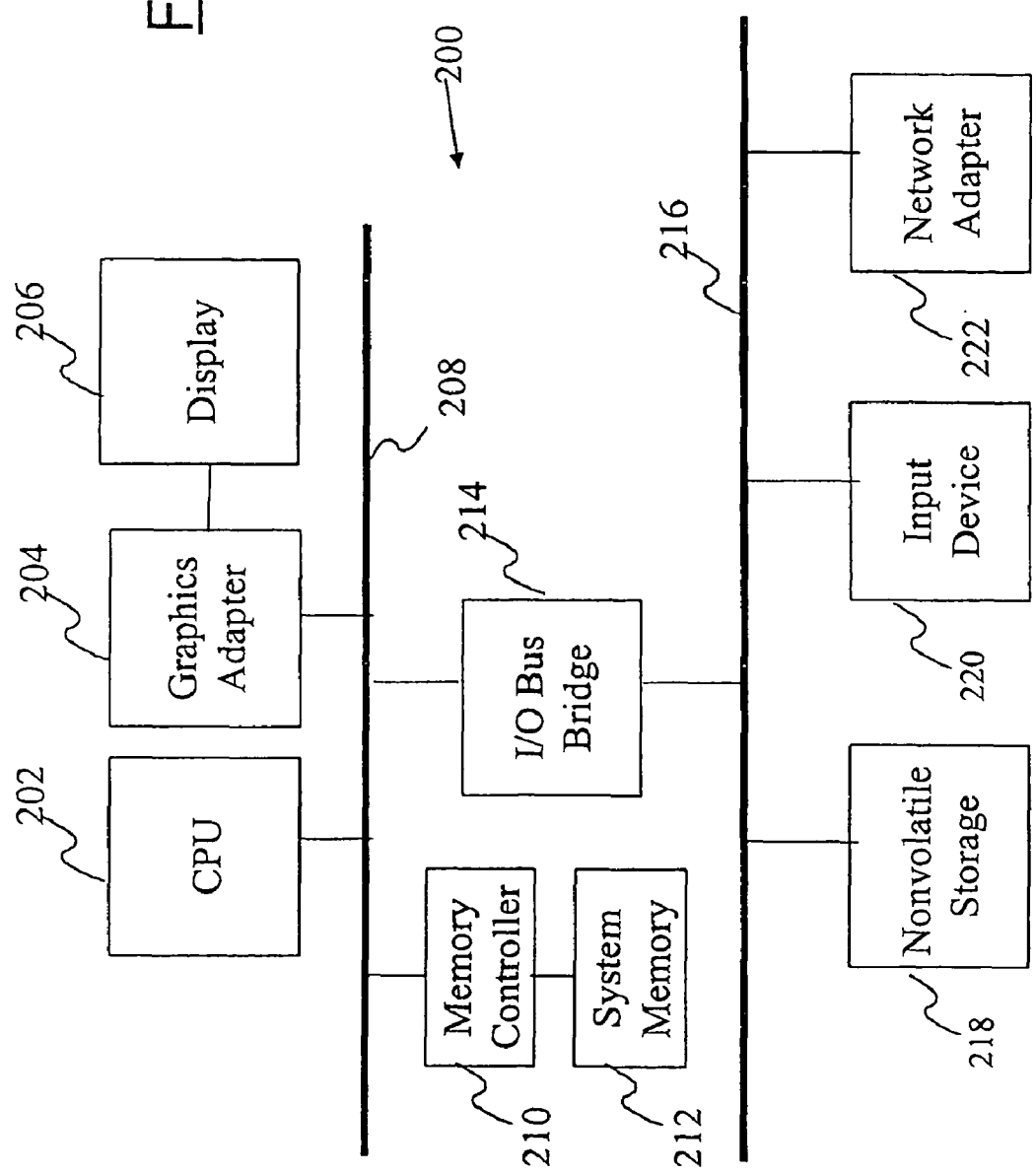
FIG. 2 depicts an exemplary computer system in which the present invention may be implemented.

With reference now to FIG. 2, there is depicted a block diagram of an exemplary data processing system in which a preferred embodiment of the present invention may be implemented. Data processing system 200 may be, for example, one of the models of personal or server computers available from International Business Machines Corporation of Armonk, N.Y. Data processing system 200 includes a central processing unit (CPU) 202, which is connected to a system bus 208. In the exemplary embodiment, data processing system 200 includes a graphics adapter 204 also connected to system bus 208, for providing user interface information to a display 206.

Also connected to system bus 208 is a memory controller 210, which controls data being read from and written to a system memory 212. System bus 208 is also connected to an input/output (I/O) bus bridge 214, which couples an I/O bus 216 to system bus 208, relaying and/or transforming data transactions from one bus to the other. Peripheral devices such as nonvolatile storage 218, which may be a hard disk drive, and input device 220, which may include a conventional mouse, a trackball, or the like, is connected to I/O bus 216. Also connected to I/O bus 216 is a network interface 222, which permits data communication with a network (not shown), which may be the Internet.

The exemplary embodiment shown in FIG. 2 is provided solely for the purposes of explaining the invention and those skilled in the art will recognize that numerous variations are possible, both in form and function. For instance, data processing system 200 might also include a compact disk read-only memory (CD-ROM) or digital versatile disk (DVD) drive, a sound card and audio speakers, and numerous other optional components. All such variations are believed to be within the spirit and scope of the present invention.

Figure 3A:
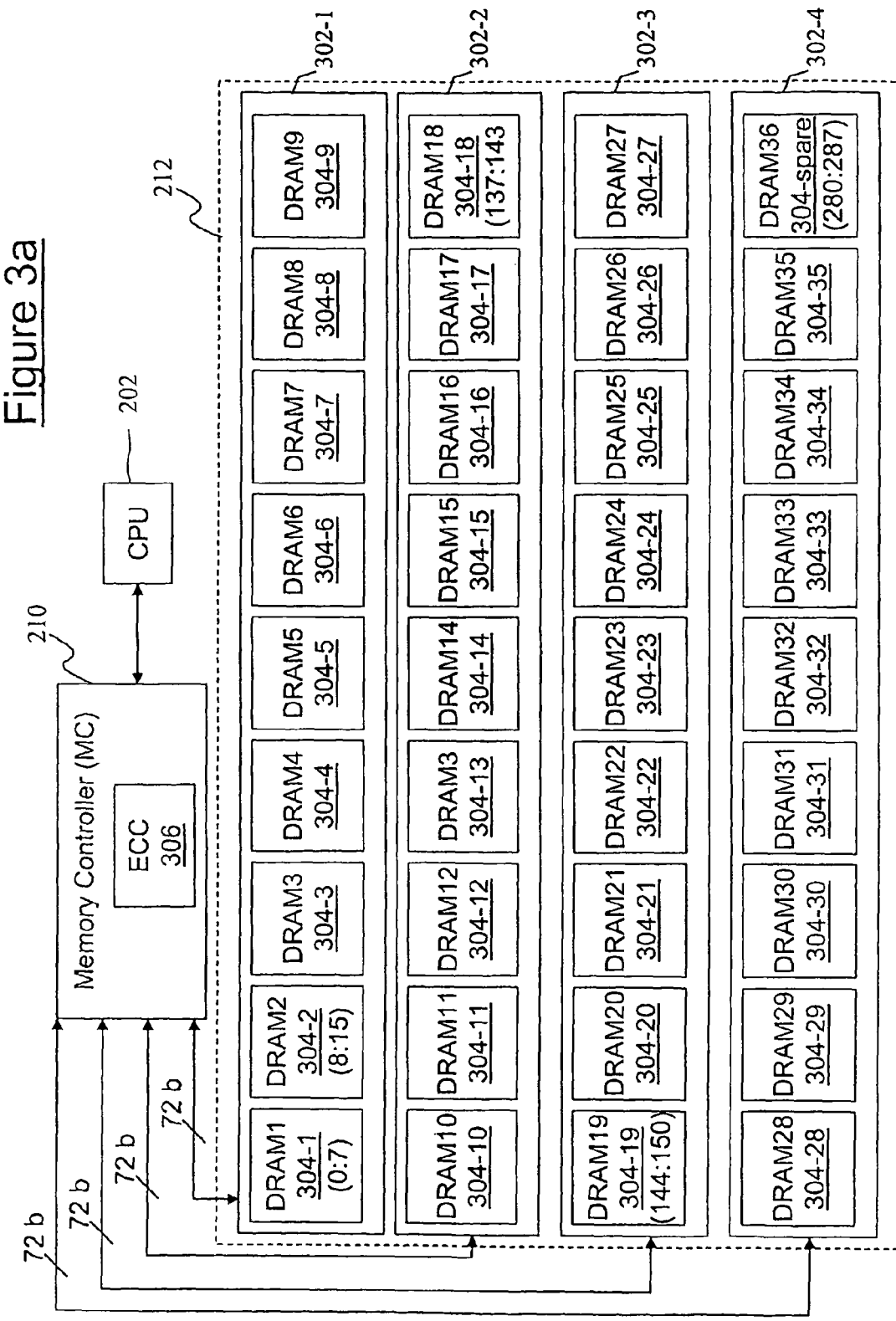
FIG. 3a illustrates a quartet of DIMMs coupled to a memory controller (MC), with the first three DIMMs having primary DRAMs and the fourth DIMM having primary DRAMs and a spare DRAM.

In a preferred embodiment, system memory 212 is composed of multiple Dual In-line Memory Modules (DIMMs) having multiple Dynamic Random Access Memory (DRAM) sub-modules (hereinafter described simply as "DRAMs"). An exemplary system memory 212 is depicted in FIG. 3a. System memory 212 is made up of four DIMMs 302, each of which has multiple DRAMs 304. Each DIMM 302 processes 72 bits at a time, for a total bandwidth to MC 210 of 288 bits. (Note that in an alternate embodiment, there may be only two DIMMs 302-1,2, such that MC 210 receives two passes of data from DIMMs 302-1,2 for a total of 288 bits.) These 288 bits are allocated as 256 bits for data (4×64), 24 bits (4×6) for Error Correction Code (ECC) bits, and 8 bits (4×2) for spares, for a total of 288 bits. This data, going between system memory 212 and CPU 202, is coordinated by MC 210.

Note that MC 210 also includes an ECC logic 306 for implementing ECC for data going to and from system memory 212. Details of the use of this ECC 306 logic are shown in the following figures.

As described in FIG. 3b, each DRAM 304 is composed of a first partition 308a and a second partition 308b. As illustrated, each partition 308 is preferably made up of contiguous bit columns. Likewise, first partition 308a is preferably the "left half" of DRAM 304 (i.e., bit spaces 0:3) and second partition 308b is preferably the "right half" of DRAM 304 (i.e., bit spaces 4:7). Alternatively, each partition 308 may be any portion of DRAM 304.

Figure 4A:
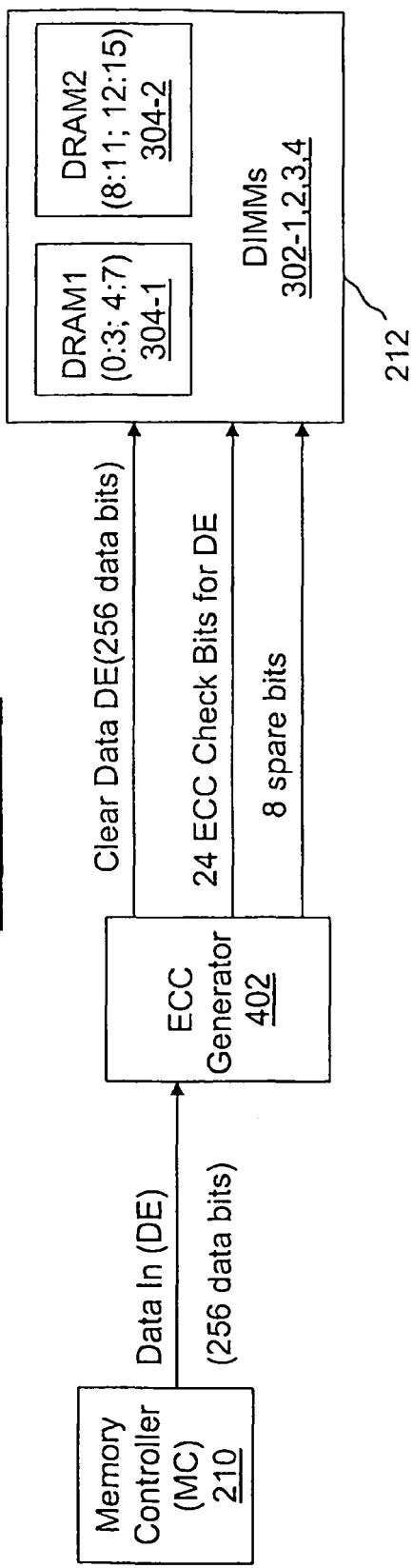
FIGS. 4a-b illustrate a system for detecting and correcting an error in data stored in a primary DRAM in a DIMM, for generating a bit steer signal based on whether the first or second partition of the primary DRAM is defective, and for creating a corrected data unit that includes a first data sub-unit in which the error originally occurred in a defective partition of the primary DRAM and a second data sub-unit that was always error free in a non-defective partition of the primary DRAM.
Figure 4B:
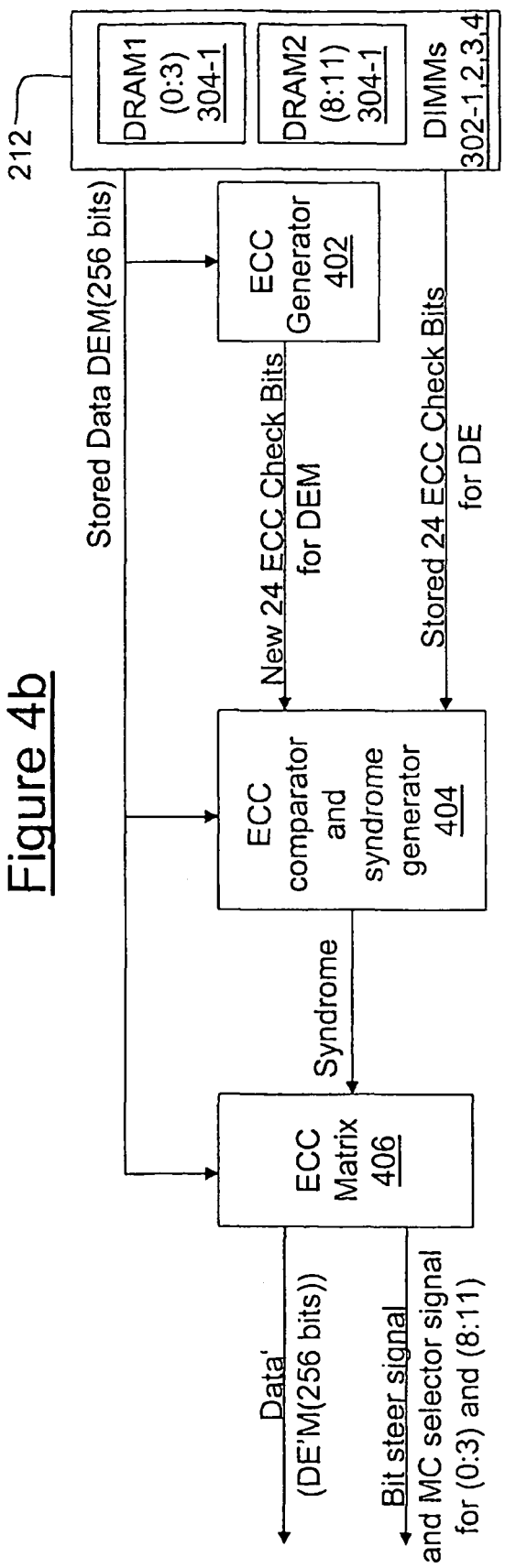

Referring now to FIGS. 4a-b, some of the components that make up ECC logic 306 are shown, including an ECC generator 402, an ECC comparator and syndrome generator 404, and an ECC matrix 406. As will be described in further detail below, ECC matrix 406 corrects an error in a data unit that was read from DIMM 302 to create a corrected data unit, determines which portion of which DRAM 304 the data error occurred, and generates a bit steer signal and a memory controller (MC) selector for MC 210 based upon which partition(s) of which DRAM(s) 304 originally produced the erroneous data.

As shown in FIG. 4a, DE describes a set of 256 bits of data, which is being sent from MC 210 to DIMMs 302-1,2,3,4, which include DRAM1 304-1 and DRAM2 304-2. DRAM1 304-1 holds data in bit locations (0:3) and (4:7), while DRAM2 304-2 holds data in bit locations (8:11) and (12:15).

The 256 bits of data in DE is first input into ECC generator 402. ECC generator 402 outputs the clear data for DE, as well as ECC check bits for DE. ECC check bits are preferably stored in one or more reserved (not shown) DRAMs 304, in a DIMM 302, which exclusively store ECC check bits.

FIG. 4b illustrates the retrieval of DE from DIMMs 302-1,2,3,4. When coming from (being read from) DIMM 302-1, DE is designated as DEM, indicating that it is being sourced from Memory. DEM is input into ECC generator 402, generating ECC check bits for DEM. The ECC check bits for DEM and the previously generated/stored ECC check bits for DE are compared by ECC comparator and syndrome generator 404. If the ECC check bits are not equal (preferably by running them through an Exclusive OR—XOR logic to generate a zero if equal and non-zero if not equal), then a syndrome is generated for DEM. A syndrome is a value that is based on the comparison of the ECC check bits for DEM. This syndrome can then be used to correct a single symbol error and detect a double symbol error in DEM. (Note that while the present invention is described as assuming that only an 8-bit symbol can be corrected, by adding additional ECC check bits, multiple bit errors can also be corrected in an 8-bit or larger symbol.) Assume for illustrative purposes that the data error that resulted in the syndrome generation was from a correctable error in data location (0:3) in DRAM1 304-1 and data location (8:11) in DRAM1 304-2.

Referring then again to FIG. 4b, ECC matrix 406 uses the syndrome generated by ECC comparator and syndrome generator 404, along with data DEM, to output corrected data (shown as DE'M) as well as bit steer signals and MC selector signals for (0:3) and (8:11). DE'M includes all data stored in DIMMs 302-1,2,3,4, including corrected and tagged data that came out of data location (0:3) and data location (8:11). As will be described and used below, bit steer signals are used to direct DE'M (subsequently identified again as DE') data back into DIMMs 302, including the data from (0:3) and (8:11). Likewise, MC selector allows MC 210 to bit steer either the data that was originally stored in (0:3) and (8:11) to a spare DRAM 304, such as DRAM 304-spare.

Figure 5A:
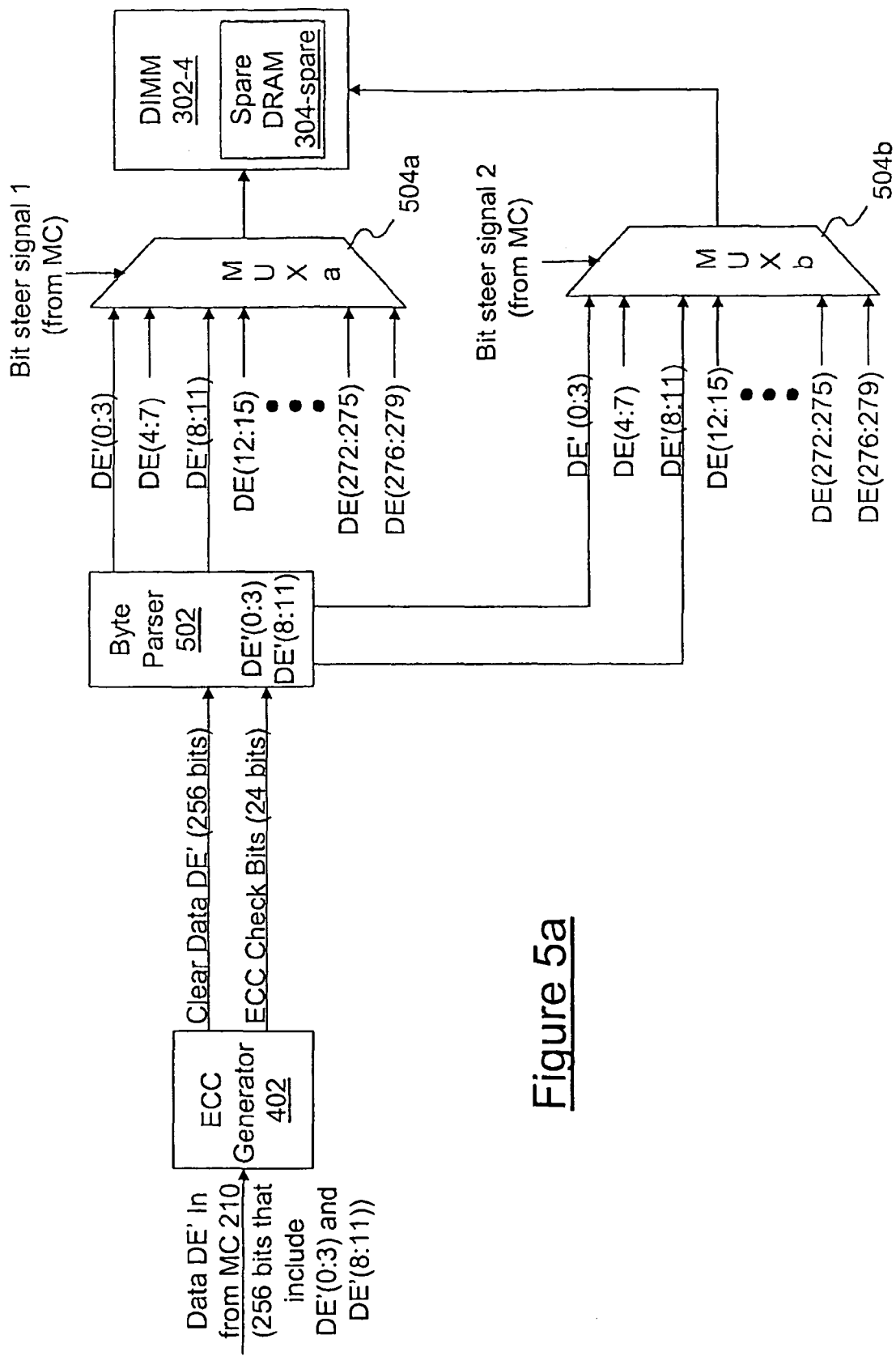
FIG. 5a depicts a system for selectively storing the first data sub-unit in the spare DRAM and the second data sub-unit in the non-defective half of the primary DRAM.

Referring then to FIG. 5a, the corrected data DE'M (which is now designated as DE' since it is sourced from MC 210, not from system memory 212), is input into ECC generator 402. ECC generator 402 generates a clear copy of DE' plus ECC check bits for DE'.

A byte parser 502 parses DE' into data components for storage into the appropriate DRAM 304 in the appropriate DIMM 302. The parsing includes parsing out of DE'(0:3) and DE'(8:11), which represents the corrected data that was read out as shown in FIG. 4b. DE' is input into a Multiplexer "a" (MUX 504a) and a Multiplexer "b" (MUX 504b). MUXs 504a-b are coupled to DRAM 304-spare in DIMM 302-4. For exemplary purposes, DRAM 304-spare is the last DRAM 304 in DIMM 302-4, shown in FIG. 3. Alternatively DRAM 304-spare may be any DRAM 304 in any DIMM 302.

If the ECC comparator and syndrome generator 404 (shown in FIG. 4b) previously determined that the error in original data DE was in the left data sub-unit of DRAM1 304-1 (bits designated as DE'(0:3)) and the left data sub-units of DRAM2 304-2 (bits designated as DE'(8:11)), then ECC matrix 406 generated bit steer select signals that MC 210 stored for use as shown in FIG. 5a. That is, MC 210 sends a bit steer signal 1 to MUX 504a that directs DE'(0:3) to be stored in DRAM 304-spare (for example, the left half of DRAM 304-spare), and a bit signal 2 to MUX 504b that directs DE'(8:11) to also be stored in DRAM 304-spare (for example, the right half of DRAM 304-spare).

Note that corrected data that is stored in Dram 304-spare may be stored in either the first partition half or second partition half of DRAM 304-spare. In addition, while it is easiest for MC 210 to map DRAM 304-spare into two equal 4-bit halves, and to section error data units into left and right 4-bit halves, alternatively any (preferably) contiguous units can be segregated and stored. Note also that while the present invention has been described using 8-bit DRAMs 304, it can also be used with other sized DRAMs, including 4-bit DRAMs (DRAMs that store 4 columns of data). For example, if the DIMM uses 4-bit DRAMS, then the left two (upper) bits and the right two (lower) bits are each discrete sub-units capable of being independently stored in either partition of a spare (4-bit) DRAM.

Figure 5B:
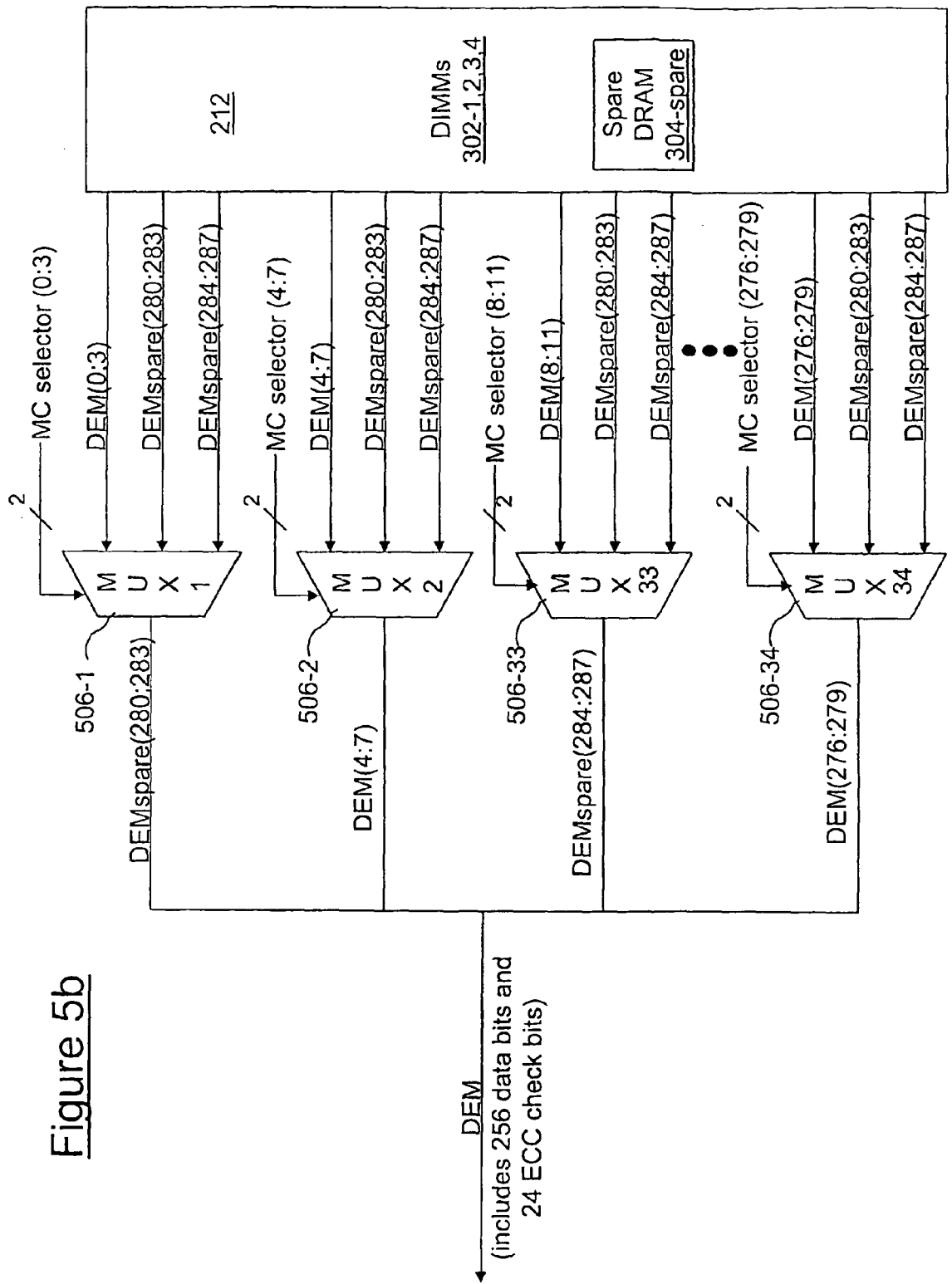
FIG. 5b depicts a plurality of multiplexers (MUXs) for selectively reading data from the primary or spare DRAMS.

FIG. 5b depicts hardware used in an exemplary preferred embodiment of the present invention for reading data out of a DIMMs 302, including from a DRAM 304-spare. Memory controller 210 (now shown in FIG. 5b) sends MC selector signals to a plurality of MUXs 506. Preferably, pairs of MUXs 506 are associated with a single DRAM 304 shown in FIG. 3. For example, MUXs 506-1,2 are associated with DRAM 304-1, which holds data at bit locations (0:7).

When reading data out of DIMMs 302, some of the data will be coming from the DRAM 304-spare. Continuing with the example above, the data that was originally stored in the primary DRAM1 304-1 in the (0:3) address, (i.e., DE(0:3)), has now been corrected and stored in DRAM 304-spare. MC 210 has mapped the new location for DE'M(0:3) as being in DRAM 304-spare, and specifically in a particular row in the bit location of (280:283). Similarly, the data that was originally stored in primary DRAMs 304-2 in the (8:11) address (i.e., DE(8:11)), has now been corrected and stored in bit location (284:287) of DRAM 304-spare.

Thus, since MC 210 knows that the data sub-unit DE'(0:3) has been stored in DRAM 304-spare at a location identified as DEMspare(280:283), and that the data sub-unit DE'(8:11) has been stored in DRAM 304-spare at a location identified as DEMspare(284:287), MC 210 can use MC selector signals to correctly steer out the data sub-units stored in DRAM 304-spare. Thus, an MC selector signal (0:3) causes DEMspare(280:283) to be read out as the replacement for DEM(0:3), and MC selector signal (8:11) causes DEMspare(284:287) to be read out as the replacement for DEM(8:11). The rest of the MUXs 506 select the DEM corresponding to their originally stored data, as indicated.

Figure 6B:
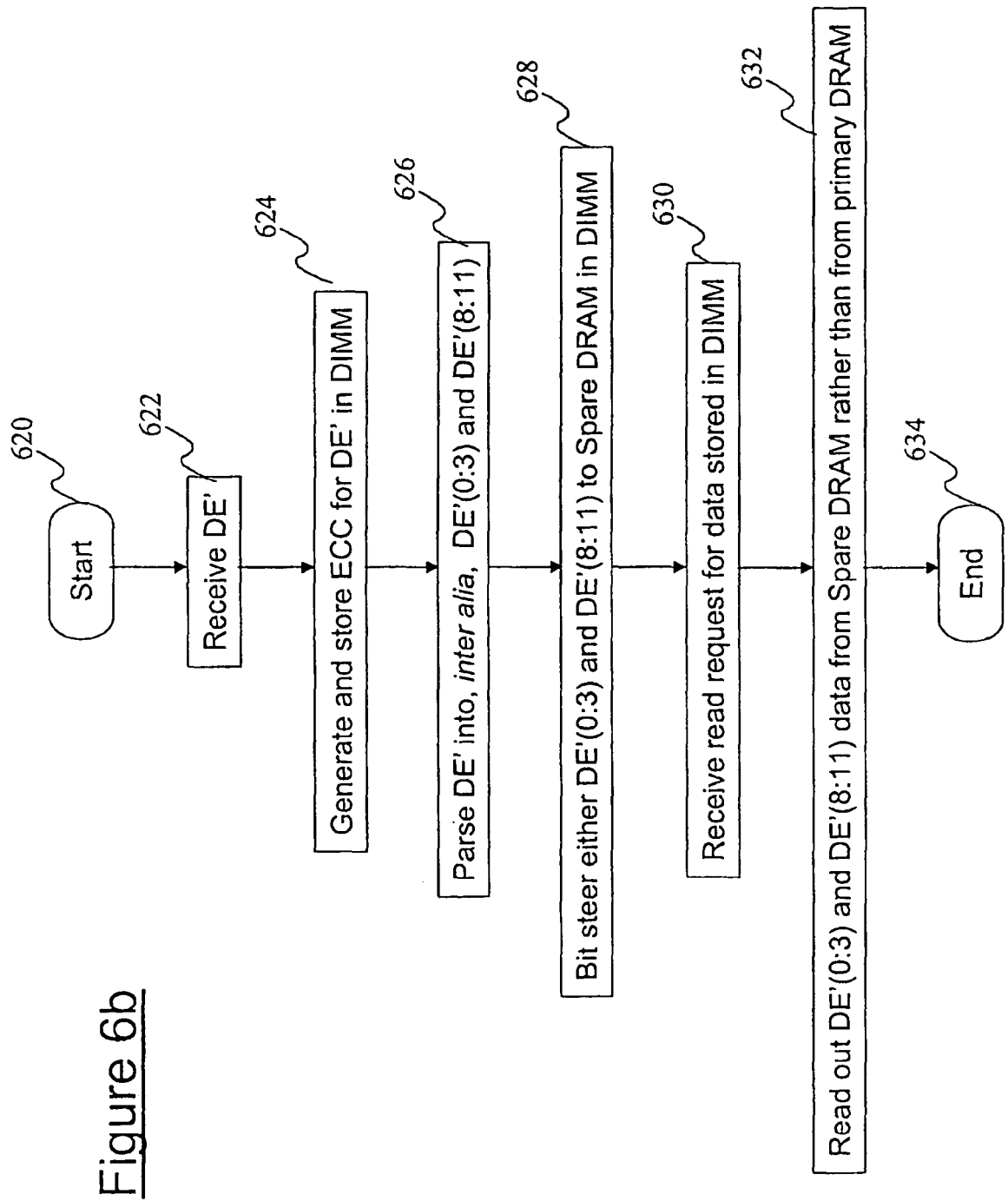
FIG. 6b is a flow-chart of steps taken to read corrected data from the primary and spare DRAMs.

Referring now to FIG. 6a, a flow-chart is depicted showing steps taken in a preferred embodiment of the present invention for correcting data stored in a DRAM in a DIMM. After initiator block 602, data and data-derived ECC bits (DE) are stored in specified DRAMs in the DIMM (block 604). The location of each DE is stored in a memory controller (MC) for future retrieval use. Upon the DIMM receiving a request from the MC for data from the DRAMs in the DIMM, the data DE is read out and given the annotation DEM, indicating that it is sourced from memory (block 606). New ECC bits are generated for the DEM (block 608), and the previously stored ECC bits for DE and the new ECC bits for DEM are compared, preferably using an XOR logic (block 610). If the old and new ECC bits are the same (query block 612), the XOR logic returns a zero and the process ends (terminator block 618). If the old and new ECC bits are different (query block 612), then an error has occurred and DE is different from DEM. In such a case, a syndrome is created for DEM, and a corrected version (DE'M) of DEM is generated (block 614). As shown in block 616, a logic determines the bit location of the error in DEM (e.g., an erroneous bit in either the left half of DEM or in the right half of DEM) and sends the memory controller a bit steer signal, which will be used later as shown in FIG. 6b.

With reference then to FIG. 6b, after initiator block 620, the corrected data, now designated DE' since it is sourced from the memory controller rather than the system memory, is received (block 622). ECC bits are generated for DE' and stored in a dedicated DRAM (a DRAM that is reserved for storing only ECC bits) in the DIMM (block 624). As shown in block 626, DE' is then parsed into, inter alia, data sub-units designated as DE'(0:3) and DE'(8:11). The memory controller knows if the error in the original DEM occurred in the (0:3) bit columns or the (8:11) bit columns. Using this information, the memory controller can bit steer the sub-units of DE', which originally had an error in the corresponding DEM, to the spare DRAM in the DIMM (block 628).

Subsequently, a request for the stored data may be received (block 630). As described in block 632, assuming that DE'(0:3) and DE'(8:11) had the bit errors, and thus were stored in the spare DRAM in the DIMM, then the DE'(0:3) and DE'(8:11) data (identified above respectively as DEMspare(280:283) and DEMspare(284:287)) are read out of the spare DRAM instead of the primary DRAMs. The process thus ends at terminator block 634.

It should be understood that at least some aspects of the present invention may alternatively be implemented in a program product. Programs defining functions on the present invention can be delivered to a data storage system or a computer system via a variety of signal-bearing media, which include, without limitation, non-writable storage media (e.g., CD-ROM), writable storage media (e.g., a floppy diskette, hard disk drive, read/write CD ROM, optical media), and communication media, such as computer and telephone networks including Ethernet. It should be understood, therefore in such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

The present invention therefore provides an efficient method and system for taking out of service only a portion of a primary memory sub-module (e.g., a DRAM) in a memory module such as a DIMM, and storing data that was originally stored in or destined for the out of service portion to a spare memory sub-module (such as a spare DRAM). Note that the present invention allows for multiple portions from the same or different DRAMs to be taken out of service. For example, a first portion of a first DRAM and a second portion of a second DRAM may be taken out of service, such that the first and second portions are in the same (same column(s)) area of each DRAM, or the first and second portions may be in different (different column(s)) areas of each DRAM. Alternatively, the first and second portions may be from the same DRAM. While the invention has been shown in a preferred embodiment as taking out a half of each DRAM, the portion being taken out may be other fractions of the DRAM. For example, if the DRAM being used is 16 bits wide, then four bit (column) areas may be taken out of service, or alternatively the out of service area may be six bits or two bits or whatever portion desired. Furthermore, while the present invention has been disclosed using two steer events, the present invention is also able to utilize multiple steer events whose number exceeds two. Note also that the DRAM-spare described above has a granularity that allows the DRAM-spare to be capable of accepting repaired data from multiple repair actions that resulted in multiple data steers.

While the invention has been particularly shown and described with reference to a preferred embodiment, it will be understood by those skilled in the art that various changes in form and detail may be made therein without departing from the spirit and scope of the invention.

What is claimed is:

1. In a data processing system having a central processing unit, a memory controller and at lease one memory subsystem, a method comprising:
   identifying a defective portion of a memory subsystem in a memory module;
   the memory controller subsequently storing data that was originally stored in the defective portion of the memory subsystem in a non-defective portion of another memory subsystem; and
   subsequently discontinuing a storing of data to the defective portion of the memory subsystem.

2. The method of claim 1, further comprising:
   reading a unit of data out of a primary memory sub-module in the memory module, the unit of data having a first data subunit and a second data subunit, the primary memory sub-module having a first partition and a second partition, wherein the first data subunit is stored in the first partition and the second data subunit is stored in the second partition;
   upon detecting an error in the unit of data:
      identifying in which of the first data subunit and the second data subunit the error was detected;
      sending a bit steer signal to the memory controller, wherein the bit steer signal describes the error as being in an indentified one of the first data subunit and the second data subunit;
      correcting the unit of data to create a corrected unit of data; and
      writing the corrected unit of data back to the memory module by:
         writing a corrected data subunit to a spare memory sub-module in the memory module; and
         writing a next data subunit that is not a corrected subunit back to an original memory sub-module of the next data subunit.

3. The method of claim 2, further comprising:
   following receipt of a read request for the corrected unit of data:
      selectively sending the corrected data subunit from the spare memory sub-module to the memory controller; and
      selectively sending the next data subunit from the original memory sub-module of the next data subunit to the memory controller.

4. The method of claim 3, wherein the selectively sending step is performed by a Multiplexer (MUX) that is controlled by the bit steer signal that was stored in the memory controller.

5. The method of claim 2, wherein the primary memory sub-module and the spare memory sub-module each have a first partition and a second partition, and wherein, when the first data subunit is the subunit with the error in the unit of data, the second data subunit is stored in the primary memory sub-module's second partition, and the first data subunit is selectively stored to either a first or a second partition of the spare memory sub-module.

6. The method of claim 2, wherein the memory controller comprises an error correction code (ECC) logic, which further comprises: (a) an ECC generator; (b) an ECC comparator; (c) a syndrome generator; and (d) an ECC matrix, said method further comprising the ECC matrix performing the functions of:
   correcting an error in the unit of data read from the memory sub-module to create a corrected data unit;
   determining in which partition of which memory sub-module the error in the unit of data occurred; and
   generating the bit steer signal and a memory controller selector based on the partition in which the error in the unit of data occurred.

7. The method of claim 1, further comprising:
   writing a unit of data to a primary memory sub-module in the memory module, the unit of data having a first data subunit and a second data subunit, the primary memory sub-module having a first partition and a second partition, wherein the first data subunit is written to the first partition and the second data subunit is written to the second partition;
   wherein the first data subunit is composed of contiguous bits and the second data subunit is composed of contiguous bits.

8. A data processing system comprising:
   a central processing unit;
   a memory controller and at least one memory subsystem;
   logic associated with the memory controller that performs the functions of:
      identifying a defective portion of a memory subsystem in a memory module;
      subsequently storing data that was originally stored in the defective portion of the memory subsystem in a non-defective portion of another memory subsystem; and
      subsequently discontinuing a storing of data to the defective portion of the memory subsystem.

9. The data processing system of claim 8, wherein said logic further performs the functions of:
   reading a unit of data out of a primary memory sub-module in the memory module, the unit of data having a first data subunit and a second data subunit, the primary memory sub-module having a first partition and a second partition, wherein the first data subunit is stored in the first partition and the second data subunit is stored in the second partition;
   upon detecting an error in the unit of data:
      identifying in which of the first data subunit and the second data subunit the error was detected;

sending a bit steer signal to the memory controller, wherein the bit steer signal describes the error as being in an indentified one of the first data subunit and the second data subunit;

correcting the unit of data to create a corrected unit of data; and writing the corrected unit of data back to the memory module by:

writing a corrected data subunit to a spare memory sub-module in the memory module; and writing a next data subunit that is not a corrected subunit back to an original memory sub-module of the next data subunit.

10. The data processing system of claim 9, wherein said logic further performs the functions of:

following receipt of a read request for the corrected unit of data:

selectively sending the corrected data subunit from the spare memory sub-module to the memory controller; and selectively sending the next data subunit from the original memory sub-module of the next data subunit to the memory controller;

wherein the logic for performing the selectively sending function comprises a Multiplexer (MUX) that is controlled by the bit steer signal that was stored in the memory controller.

11. The data processing system of claim 9, wherein the primary memory sub-module and the spare memory sub-module each have a first partition and a second partition, and wherein, when the first data subunit is the subunit with the error in the unit of data, the second data subunit is stored in the primary memory sub-module's second partition, and the first data subunit is selectively stored to either a first or a second partition of the spare memory sub-module.

12. The data processing system of claim 8, wherein said logic further performs the functions of:

writing a unit of data to a primary memory sub-module in the memory module, the unit of data having a first data subunit and a second data subunit, the primary memory sub-module having a first partition and a second partition, wherein the first data subunit is written to the first partition and the second data subunit is written to the second partition;

wherein the first data subunit is composed of contiguous bits and the second data subunit is composed of contiguous bits.

13. The data processing system of claim 8, wherein the memory controller comprises an error correction code (ECC) logic, which further comprises: (a) an ECC generator; (b) an ECC comparator; (c) a syndrome generator; and (d) an ECC matrix, said logic further comprising the ECC matrix performing the functions of:

correcting an error in the unit of data read from the memory sub-module to create a corrected data unit;

determining in which partition of which memory sub-module the error in the unit of data occurred; and generating a bit steer signal and a memory controller selector based on the partition in which the error in the unit of data occurred.

14. A memory controller for use within a device having at least one memory subsystem with a primary memory sub-module and a spare memory sub-module, said memory controller comprising logic for performing the functions of:

identifying a defective portion of the memory subsystem in a memory module;

subsequently storing data that was originally stored in the defective portion of the memory subsystem in a non-defective portion of the memory subsystem; and subsequently discontinuing a storing of data to the defective portion of the memory subsystem.

15. The memory controller of claim 14, wherein said logic comprises:

an Error Correction Code (ECC) matrix which performs the functions of:

correcting an error in a data unit that was read from the memory module to create a corrected data unit;

determining whether the error in the data unit was in a first or second data sub-unit of the data unit; and generating a Memory Controller (MC) bit steer signal based on the error in the data unit being in the first data sub-unit;

a data unit parser which performs the functions of, after receiving the corrected data unit for storage back to the at least one memory module, parsing the corrected data into data sub-units that correspond with the first and second data sub-units; and a bit steering mechanism for:

bit steering the corrected data's first sub-unit to the spare memory sub-module; and bit steering the corrected data's second sub-unit to the primary memory sub-module.

16. The memory controller of claim 14, further comprising:

a first plurality of multiplexers (MUXs) that includes a first MUX and a second MUX, wherein the first MUX selectively sends the corrected data's first sub-unit to the spare memory sub-module and the corrected data's second data sub-unit to the primary memory sub-module.

17. The memory controller of claim 16, further comprising:

a second plurality of MUXs that includes a third MUX and a fourth MUX, wherein the third MUX uses the MC bit steer signal to selectively send the first data sub-unit from the spare memory sub-module to the memory controller, and wherein the fourth MUX uses the MC bit steer signal to selectively send the second data sub-unit from the primary memory sub-module to the memory controller.

18. The memory controller of claim 14, wherein the memory subsystem comprises one or more features from among:

(a) the at least one memory modules are Dual In-Line Memory Modules (DIMMs);

(b) the sub-modules are Dynamic Random Access Memories (DRAMs);

(c) the DRAMs are 8-bits wide, and wherein the first data sub-units are stored in a first partition of the DRAM and wherein the second data sub-units are stored in a second partition of the same DRAM; and (d) the primary and spare memory sub-modules are on separate memory modules.

19. A non-transitory computer readable storage medium having encoded thereon program code that provides the functions performed by the logic of claim 14 when executed in a memory subsystem.

* * * * *